United States Patent

Fujimori

[11] Patent Number: 6,124,547
[45] Date of Patent: Sep. 26, 2000

[54] TAPE CARRIER PACKAGE

[75] Inventor: Yoshikazu Fujimori, Suwa, Japan

[73] Assignee: Seiko Epson Corporation, Tokyo, Japan

[21] Appl. No.: 09/023,113

[22] Filed: Feb. 13, 1998

[30] Foreign Application Priority Data

Feb. 17, 1997 [JP] Japan .................................. 9-032473
Oct. 15, 1997 [JP] Japan .................................. 9-282170

[51] Int. Cl.⁷ .................................................. H05K 5/06
[52] U.S. Cl. ........................ 174/52.2; 257/668; 257/787
[58] Field of Search ............................ 174/52.2, 52.4; 257/787, 667, 668; 438/124, 126, 127

[56] References Cited

U.S. PATENT DOCUMENTS 5,744,859  4/1998  Ouchida ............................ 257/668

FOREIGN PATENT DOCUMENTS 0 482 940 A1   4/1992   European Pat. Off. .
0 4880554 A2   6/1992   European Pat. Off. .
63-95639       4/1988   Japan .
7-226418       8/1995   Japan .
8-186154       7/1996   Japan .
8-236584       9/1996   Japan .

OTHER PUBLICATIONS

JP 63–095639 A (Mitsubishi Electric Corporation) Patent Abstracts of Japan, vol. 12, No. 330 (E–655), Sep. 7, 1998 (Abstract).

*Primary Examiner*—Kristine Kincaid
*Assistant Examiner*—Hung V Ngo
*Attorney, Agent, or Firm*—Oliff & Berridge, PLC

[57] ABSTRACT

The invention provides a tape carrier package. An integrated circuit element has a free edge that is not provided with electrodes. A flexible film defines a device hole that is smaller than the integrated circuit element and in which the electrodes of the integrated circuit element are disposed. A plurality of leads are provided on the flexible film and connected to the electrodes through the device hole. At least one flow control member is disposed between the integrated circuit element and the flexible film. The flow control member controls a flow of a resin along the free edge of the integrated circuit element.

18 Claims, 7 Drawing Sheets

TAPE CARRIER PACKAGE

BACKGROUND OF THE INVENTION

1. Field of Invention

The present invention relates to TAB (Tape Automated Bonding) technology in which integrated circuit element, such as, for example, ICs, LSIs and other electronic parts, are mounted on a film carrier.

2. Description of Related Art

Recent liquid crystal display apparatus typically use TAB for connecting their driver circuits to LCD cells, in which driver ICs are mounted on what is generally called a tape carrier package, or a COG (Chip On Glass) technology in which driver ICs are directly connected to the substrate. Tape carrier packages are small and thin compared with other types of packages and suitable for high-density mounting. There are also other advantages. For example, electrical examinations can be performed on the film carrier tapes, and the tape carrier packages can be bent for mounting. Accordingly, they are used not only for liquid crystal display apparatus, but also for a variety of other electronic apparatus.

Figure 11:
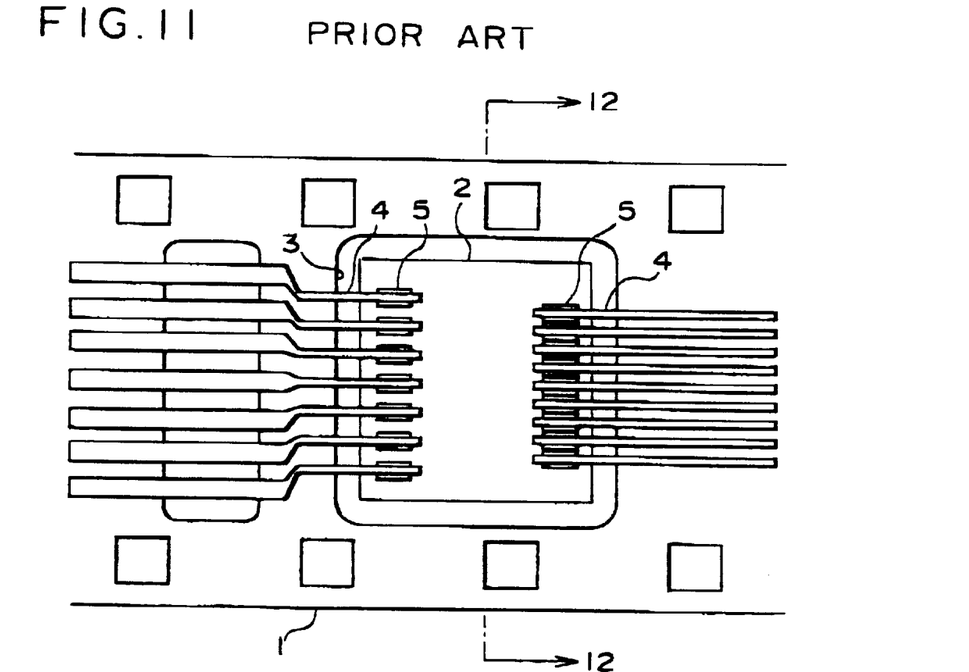
FIG. 11 is a plan view of an example of a conventional tape carrier package structure.

Conventional tape carrier packages include, as shown in FIG. 11, a film carrier 1 formed from polyimide or the like defining a device hole 3 that is larger than the size of an integrated circuit element 2 to be mounted on the film carrier 1. Inner leads 4 protruding into the interior of the device hole are connected to electrodes of the integrated circuit element 2 through bumps 5.

Figure 12:
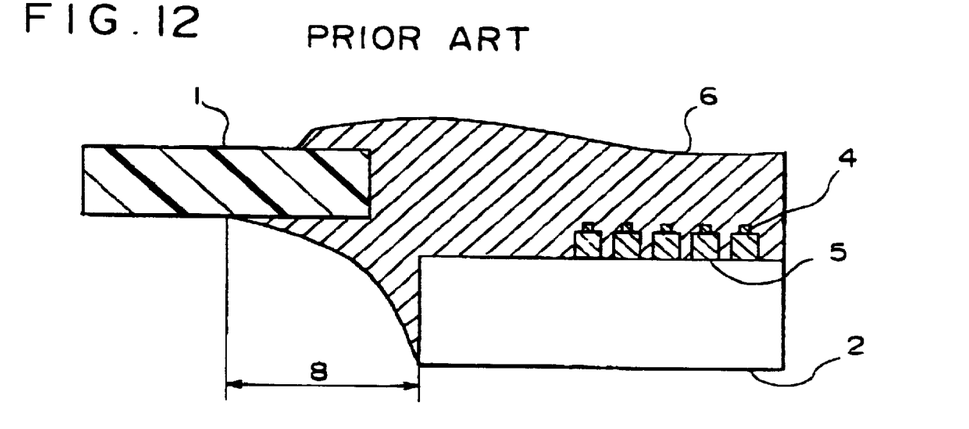
FIG. 12 shows a cross-section in part of the example of FIG. 11 taken along lines 12—12.

Furthermore, to prevent cross-talk between the inner leads 4 and contact between the inner leads 4 and the integrated circuit element 2, thereby improving reliability, a protection resin 6 is used to cover the inner leads 4 and the surface of the integrated circuit element 2. This is shown in FIG. 12, which is a cross-sectional view taken along lines 12—12 of FIG. 11. The electrodes or the bumps 5 are typically disposed along peripheral edges of the integrated circuit element 2 to shorten as much as possible the length of the inner leads 4 that are in the form of cantilevers.

Also, as described, for example, in Japanese Laid-Open Patent Application No. SHO 63-95639, when an integrated circuit element 2 having many large electrodes is mounted, a known structure is used. In the structure, a lead support section that extends into a device hole is provided on a film carrier, and inner leads are in part extended over the lead support section.

In recent years, to further reduce the size of the above-described tape carrier packages, a film carrier 1 is provided with a device hole 3 that is smaller than the size of an integrated circuit element 2 to be mounted, and inner leads 4 protruding in the device hole are connected to electrodes that are provided adjacent the central area of the integrated circuit element 2 through bumps 5. See FIG. 13.

Figure 13:
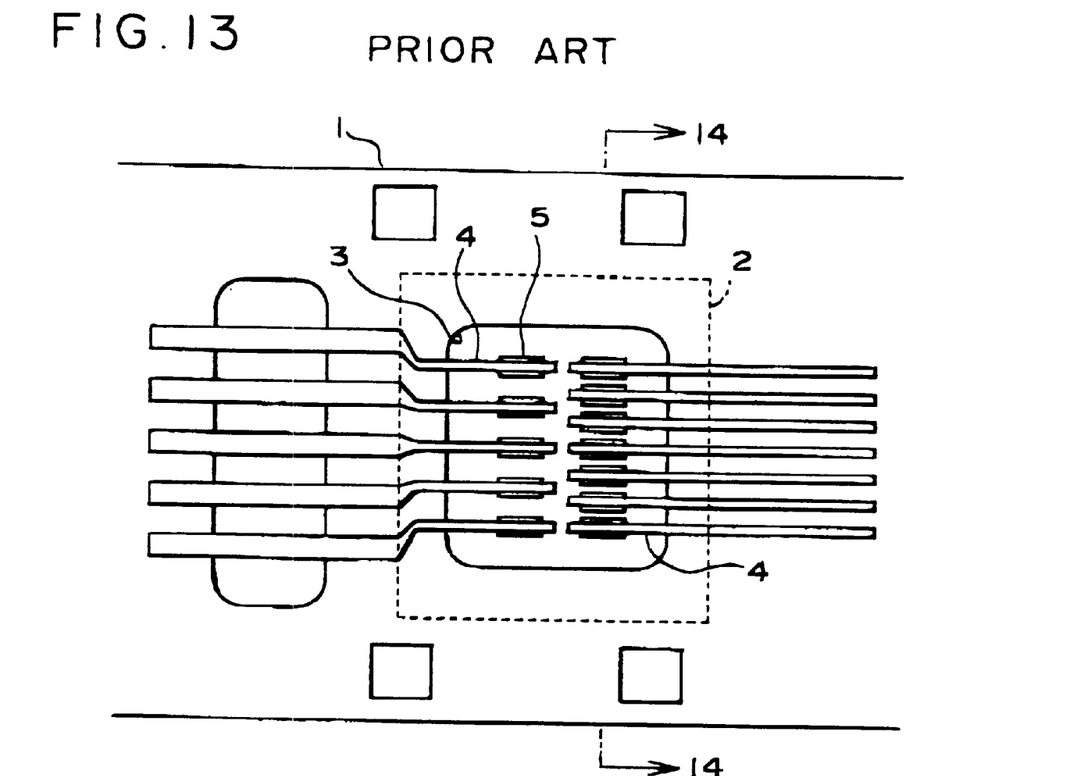
FIG. 13 is a plan view of another example of a conventional tape carrier package structure.

However, in the above-described tape carrier package, the device hole is rectangular in its plan view. In particular, when the inner leads 4 are provided along only two opposing edges of the device hole 3, and the inner leads 4 are connected to the integrated circuit element 2, no inner leads to be connected to the integrated circuit element 2 are present along edges located at the ends of these opposing edges. When protection resin is coated on the inner leads 4 and the surface of the integrated circuit element 2 where the inner leads 4 are connected to the bumps 5, the inner leads 4 act as resistance and prevent the flow of the protection resin 6. Where there are no inner leads 4 connected to the bumps 5, only a separation between the film carrier 1 and the integrated circuit element 2 provides a resistance factor that influences the fluidity of the protection resin 6.

Figure 14:
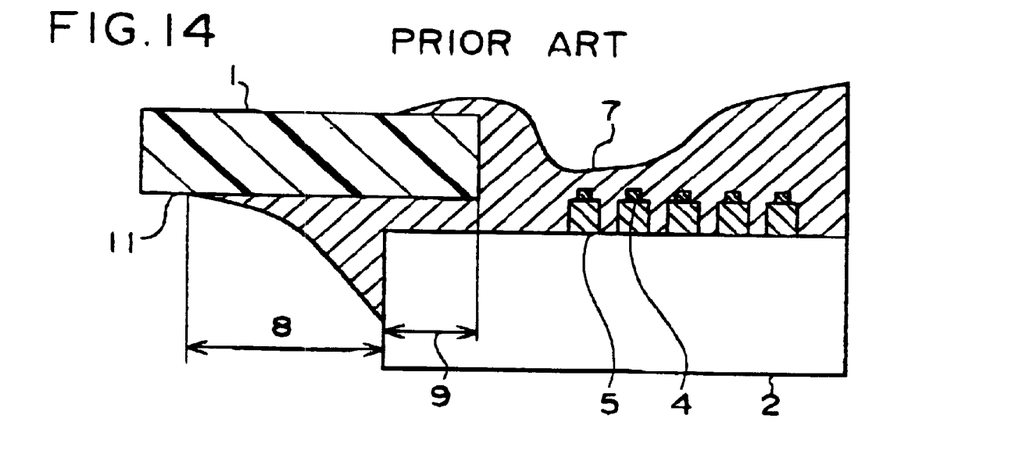
FIG. 14 shows a cross-section in part of the example of FIG. 13 taken along lines 14—14.

Therefore, the condition of areas coated with the protection resin 6 varies depending on the presence or absence of the inner leads 4 that are connected to the bumps 5. As a result, when the protection resin 6 is coated on the surfaces of the integrated circuit element 2 and the inner leads 4, the protection resin 6 flows through a gap 9 toward the peripheral edges of the integrated circuit element 2, and the flow width 8 of the protection resin 6 becomes greater. As a consequence, a recess portion 7 is generated in the protection resin, as shown in FIG. 14, and the required thickness of the protection resin 6 may not be provided on the entire surface.

SUMMARY OF THE INVENTION

The present invention has been made to solve the above-described problems. It is an object of the present invention to reduce the flow of protection resin that is coated on an integrated circuit element and leads, to side edges thereof, and assure a uniform thickness of the protection resin on a surface where the resin is coated. It is also an object of the present invention to restrict the increase in the size of the plane surface resulting from the flow of the protection resin to the side edges (a portion of the width 8 of the flow of the protection resin as shown in FIG. 14) to thereby reduce the size of tape carrier packages, and reduce the amount of protection resin to be used to thereby contemplate the reduction of manufacturing cost.

To achieve the above-described objects, a tape carrier package according to the present invention has an integrated circuit element having an edge free from electrodes (i.e., not provided with electrodes), a flexible film defining a device hole that is smaller than the integrated circuit element in which electrodes of the integrated circuit element are disposed, leads connected to the electrodes through the device hole, and a flow control member disposed between the integrated circuit element and the flexible film for controlling the flow of resin along the free edge(s) of the integrated circuit element.

Along free edges among the four edges of the device hole where leads are not provided in the flexible film side and the integrated circuit element does not have electrodes to be connected to the leads, the flow control member narrows a gap through which the resin flows between the integrated circuit element and the flexible film that are overlapped with each other. This reduces the amount of the protection resin to be coated on the surfaces of the leads and the integrated circuit element that flows through the gap to the side edge sections. As a result, the thickness of the protection resin on the integrated circuit element is not influenced by the amount of the protection resin that is coated, and the length of the protection resin that extends beyond the edge of the integrated circuit element is limited within an extent of the gap between the flexible film and the integrated circuit element. Accordingly, the size of the tape carrier package can be made smaller.

A plurality of the flow control members can be provided along the free edges of the integrated circuit. By using a plurality of the flow control members, the number of the flow control members and the gap between the flow control members can be adjusted depending on the viscosity of the protection resin and how easy the protection resin flows. As a result, the length of the protection resin that extends beyond the peripheral edge of the integrated circuit element can be readily controlled. The plurality of flow control members can be disposed within a width of the device hole that corresponds to the free edge(s).

In the above-described invention, the flow control member is not disposed adjacent the corner section of the integrated circuit element where electrodes are not typically formed. Therefore, when the protection resin has a high viscosity (for example, more than 900 poise), or a high thixotropy (for example, more than 2.0) in addition to a high viscosity, the resin flows well at the corner section, and the protection resin having a low fluidity is uniformly flowed.

The plurality of flow control members can be disposed along a length exceeding the width of the device hole that corresponds to the free edge(s). Moreover, the number and the disposing length of the plurality of flow control members that are to be disposed along a free edge of the integrated circuit element can be appropriately selected based on the fluidity of the protection resin. Thus, a uniform flow of the resin can be secured.

A tape carrier package according to the present invention can be an integrated circuit element having a free edge that is not provided with electrodes, a flexible film defining a device hole that is smaller than the integrated circuit element and in which electrodes of the integrated circuit element are disposed, leads connected to the electrodes through the device hole, and a plurality of flow control members disposed between the integrated circuit element and the flexible film for controlling a flow of resin along any free edge of the integrated circuit element that is not provided with electrodes and corner areas located at ends of the edge. The flow control members can be disposed in the corner section of the integrated circuit element where leads are not typically provided. As a result, when the protection resin has a low viscosity (for example, less than 100 poise), and a low thixotropy (for example, less than 1.1) in addition to a low viscosity, the resin is prevented from flowing through the corner section in an amount more than required, so that the resin having a high degree of fluidity is uniformly flowed. The plurality of flow control members can be disposed at equal intervals. Accordingly, the flow of the resin between each adjacent members becomes uniform, and a uniform resin filling is achieved. The plurality of flow control members may be disposed in a row.

The flow control members have a structure identical with convex shaped electrodes that connect the leads provided on the integrated circuit element and the integrated circuit element. Moreover, the flow control members and the integrated circuit can be formed at the same time. Therefore, the number of steps to manufacture a tape carrier package does not increase and increased manufacturing cost is prevented.

The flow control members may be formed from resin, for example, epoxy resin, polyimide resin and the like. As a result, a protruded object can be formed to a desired height. Therefore, even when the gap distance between a flexible film and an integrated circuit element is small, such a situation can be flexibly handled and short circuits or similar problems are not likely to occur.

In the above-described invention, a gap between adjacent ones of the plurality of protruded sections can be made smaller so that the amount of the protection resin that flows through the gap to the side edge section can be reduced. On the other hand, a gap between adjacent ones of the plurality of protruded sections can be made wider so that the flow amount of the protection resin can be increased. Accordingly, the length of the protection resin that outwardly extends beyond the edge section of the integrated circuit element can be readily set to a desired value.

In the above-described invention, the effect obtained by the tape carrier package can be multiplied by increasing or decreasing a separation between the lows of the flow control members in addition to a gap between adjacent ones of the flow control members. As a result, the length of the protection resin that outwardly extends beyond the edge section of the integrated circuit element can be more minutely adjusted.

The plurality of flow control members can be disposed in two or more rows. The flow control members in one of the plurality of rows of the flow control members can be arranged in a phase deviating from the flow control members in an adjacent one of the rows. For example, when the flow control members are arranged in two rows, the flow control members are arranged in a staggered manner so that the resin flow can be more easily and accurately controlled, and the length of the protection resin that outwardly extends beyond the edge section of the integrated circuit element can be more minutely adjusted.

In a tape carrier package having a press-down forming amount of the leads between 50 $\mu$m to 150 $\mu$m, the distance between the electrodes of the integrated circuit element and the flow control members is between 150 $\mu$m to 850 $\mu$m. According to the invention thus structured, when the electrodes of the integrated circuit element and the leads are bonded with heat and pressure by a bonding tool, heat damage to the flexible film, that may be caused if the bonding tool touches the flexible film, can be prevented.

BRIEF DESCRIPTION OF THE DRAWINGS

Embodiments of the invention will be described with reference to the accompanying drawings, in which.

DETAILED DESCRIPTION OF PREFERRED EMBODIMENTS

Figure 1:
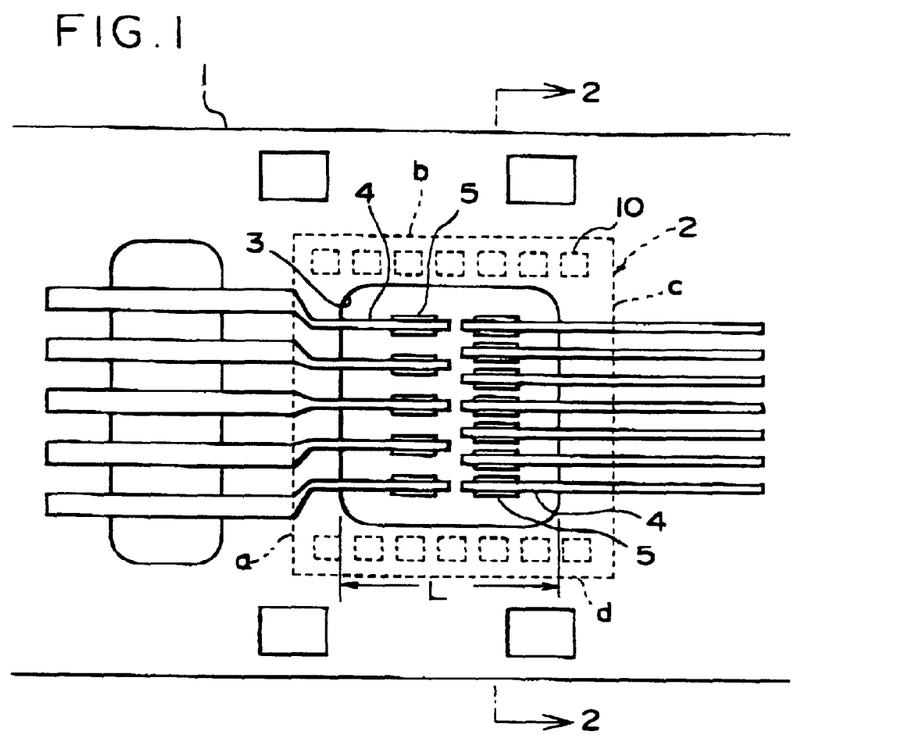
FIG. 1 is a plan view of a first embodiment of the present invention.
Figure 2:
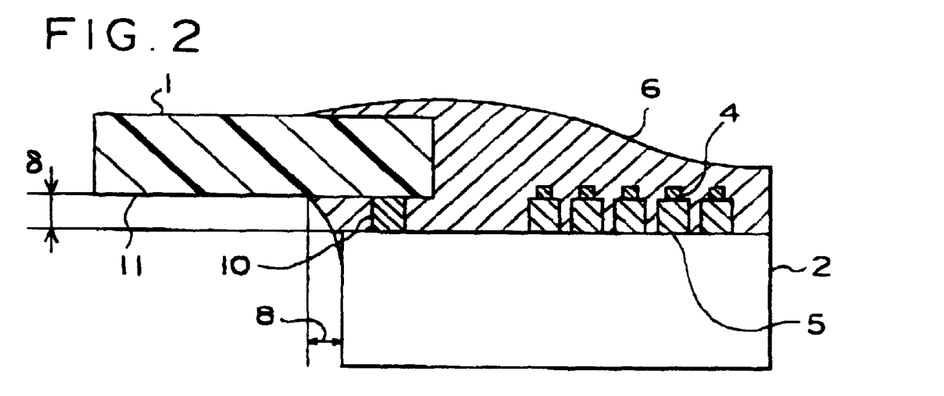
FIG. 2 is a cross-sectional view taken along lines 2—2 in part of the embodiment of FIG. 1.

FIG. 1 is a plan view of a tape carrier package in accordance with a first embodiment of the present invention, and FIG. 2 is a cross-sectional view of a portion taken along lines 2—2.

The first embodiment is implemented in a tape carrier package in which an integrated circuit element and leads provided on a film carrier are connected only along two opposing edges. Its structure will now be described. A device hole 3 is defined in a film carrier 1 that is formed from a flexible film that forms a substrate. The device hole 3 is smaller than the size of an integrated circuit element 2 that is mounted thereon. Inner leads 4 that protrude in the interior of the device hole 3 are connected through bumps 5 to electrodes that are located adjacent a central area of the integrated circuit element 2. An active surface of the integrated circuit element 2 and a peripheral area of the device hole 3 are sealed by a protection resin 6.

In the above structure, the bumps 5 for connecting to the inner leads 4 are disposed along edges a and c of the integrated circuit element 2. However, bumps for connecting to the inner leads 4 are not provided along the remaining edges b and d. Therefore, the edges a and c of the integrated circuit element 2 are connected to the film carrier 1 through the inner leads 4. However, the free edges b and d of the integrated circuit element 2 that are not provided with electrodes are not connected to the carrier tape through the inner leads 4. Protrusions 10, that serve as flow control members, are disposed along the free edges b and d of the integrated circuit element 2 between the integrated circuit element 2 and the film carrier 1. The protrusions 10 are disposed in a single row along each of the edges b and d, and in a width greater than the width L of the side edges of the device hole 3 corresponding to the free edges b and d.

The protrusions 10 have the same structure as the protruded electrodes of the integrated circuit element 2 and the same height as the bumps 5, which range between 10 $\mu$m and 30 $\mu$m and are disposed at a location 20 $\mu$m to 40 $\mu$m inside of peripheral edges of the integrated circuit element 2. When the integrated circuit element 2 is mounted on the tape carrier, the inner leads 4 and the bumps 5 are coupled, and a gap $\delta$ between the integrated circuit element 2 and a surface 11 of the film carrier 1 facing the integrated circuit element 2 is set to the same height as the protrusions 10 that are previously mounted on the integrated circuit element 2.

As a result, upper surfaces of the protrusions 10 contact the surface of the film carrier 1 that face the integrated circuit element 2. The protrusions 10 contacting the film carrier 1 create fluid resistance against the protection resin 6 similar to that generated by the inner leads 4 connected to the bumps 5. In other words, the flow of the protection resin 6, that flows along the edges b and d, is restricted by the protrusions 10 which define flow control members. As a result, the protection resin 6 has a flow width 8 that is similar to the flow width along the edges a and c, so that the protection resin 6 can be uniformly flowed and spread. Moreover, since an excessive flow of the protection resin 6 is prevented by the protrusions 10, the flow width 8 becomes smaller and thus the tape carrier package can be miniaturized.

Also, as a plurality of the protrusions 10 are disposed in a row, the gaps between the adjacent protrusions 10 may be made narrower so that the amount of the protection resin 6 flowing through the gaps to the side sections is reduced. On the other hand, by widening the gaps between the adjacent protrusions 10, the flow amount of the protection resin 6 is increased. As a result, the flow length of the protection resin 6 that flows out beyond the peripheral edges of the integrated circuit element 6 is readily set to a desired length. Also, the range in which the protrusions 10 are provided may be adjusted depending on the fluidity of the protection resin 6. As a result, the flow range of the protection resin is readily adjusted.

Figure 3:
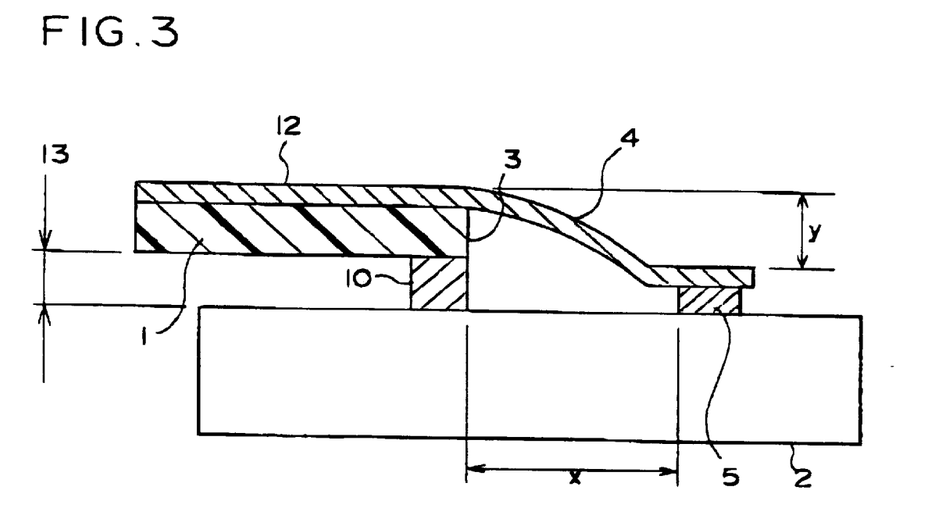
FIG. 3 is an explanatory view of an example of a second embodiment of the present invention.
Figure 4:
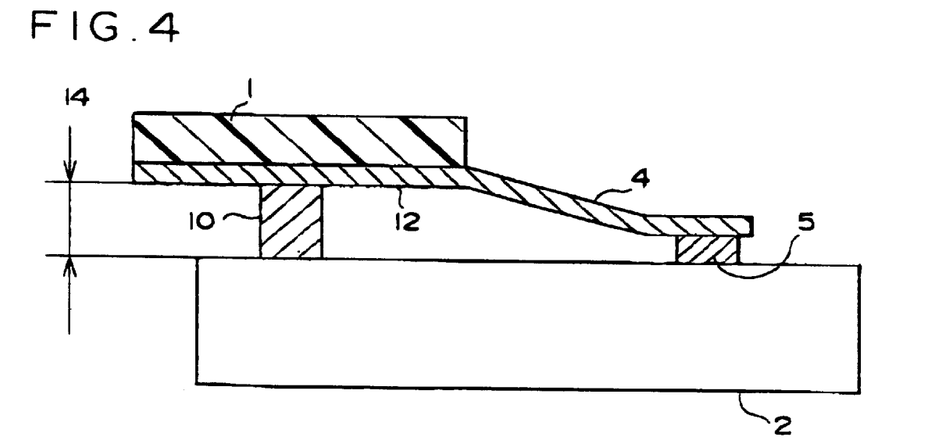
FIG. 4 is an explanatory view of another example of the second embodiment of the present invention.

FIGS. 3 and 4 are explanatory views of a tape carrier package in accordance with a second embodiment of the present invention. The basic structure of the tape carrier package shown in these figures is the same as that of the first embodiment shown in FIGS. 1 and 2. Here, forming of the protrusions 10 will be described.

The protrusions 10 are formed by dripping resin such as polyimide resin, epoxy resin and the like on the integrated circuit element 2 to form protrusions and hardening the protrusions. Alternatively, a film of resin such as polyimide resin, epoxy resin and the like is coated in advance on the integrated circuit element 2 to a thickness equivalent to the required height of the protrusions 10. The film is selectively removed to form the protrusions by a liquid such as nitric acid or the like that can resolve the protection resin. An object to form the protrusions 10 by resin in this manner is to deal with the factors relating to the basic structure of the tape carrier package.

In a typical tape carrier package, a surface of the film carrier 1 on which metal wire 12 is disposed and the surface of the integrated circuit element 2 may face away from each other, as shown in FIG. 3, or may face each other, as shown in FIG. 4. In both of the cases, contact between the metal wire 12 on the film carrier 1 and the integrated circuit element 2 in undesired portions needs to be avoided. Therefore, in the case of the structure shown in FIG. 4 in which the integrated circuit element 2 and the metal wire 12 disposed on the film carrier 1 face each other, a sufficient separation is required to be provided between the integrated circuit element 2 and the metal wire 12. Also, a separation 14 defined when the integrated circuit element 2 and the metal wire 12 face each other needs to be greater than a separation 13 defined when the integrated circuit element 2 and the metal wire 12 do not face each other. In other words, depending on whether or not the metal wire 12 and the integrated circuit element 2 face each other, the height of protrusions disposed on the integrated circuit element needs to be changed. In this respect, by forming the protrusions 10 by resin, tape carrier packages can be formed without being affected by the position of the metal wire 12 on the film carrier.

Figure 5:
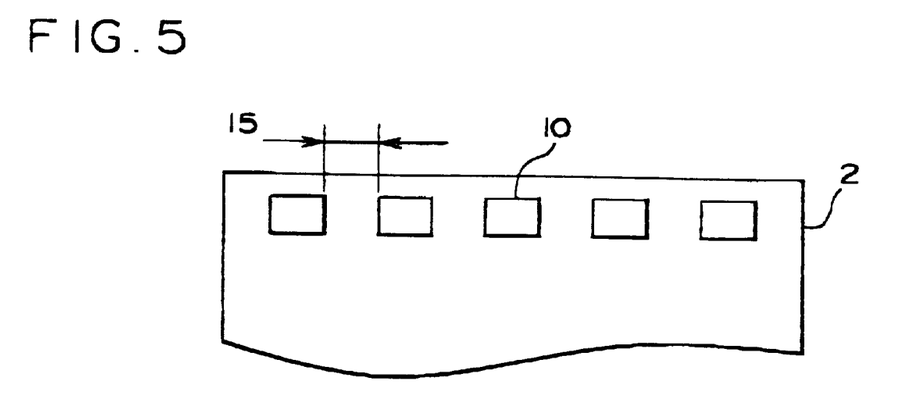
FIG. 5 is a plan view of a main portion of an example of a third embodiment of the present invention.
Figure 6:
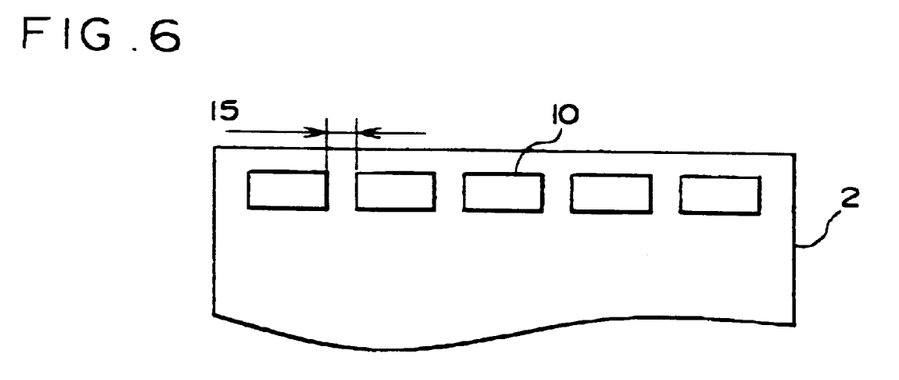
FIG. 6 is a plan view of a main portion of another example of the third embodiment of the present invention.

FIGS. 5 and 6 show tape carrier packages in accordance with a third embodiment of the present invention. The basic structure is the same as the one shown in FIG. 1. Embodiment shape and arrangement of the protrusions 10 of FIG. 1 are shown in FIGS. 5 and 6. A plurality of protrusions 10 are disposed in a row at equal intervals in parallel with the device hole.

As described above, the protrusions 10 contact the film carrier 1. Therefore, the protection resin flows through the gaps 15 between the protrusions to the peripheral edge section of the integrated circuit element 2, and extends outside of the peripheral edge section of the integrated circuit element 2 by a flow length 8, as shown in FIG. 2. When the gap 15 between the protrusions 10 is narrowed by increasing the width of the protrusion 10, as shown in FIG. 6, the fluid resistance to the protection resin 6 increases, and as a result, the flow length 8 becomes smaller. By this structure, a desired flow length 8 of the protection resin 6 as shown in FIG. 2 is obtained in a typical tape carrier package shown in FIG. 1.

It is noted that, when the protrusions 10 are provided adjacent the edge section of the device hole, as shown in FIG. 3, and a press-down forming amount y to connect the inner leads 4 to the bumps 5 is 50 $\mu$m to 150 $\mu$m, the distance x between the bumps 5, i.e., the electrodes of the integrated circuit element 2, and the protrusions 10 is preferably 150μm to 850 μm. When the distance x is set in such a range, and when the inner leads 4 are heat-and-pressure bonded to the bumps 5 by a bonding tool, the bonding tool does not contact the tape carrier 1. As a result, heat damage to the tape carrier 1 is prevented, and enlargement of the size of the tape carrier package is prevented.

Figure 7:
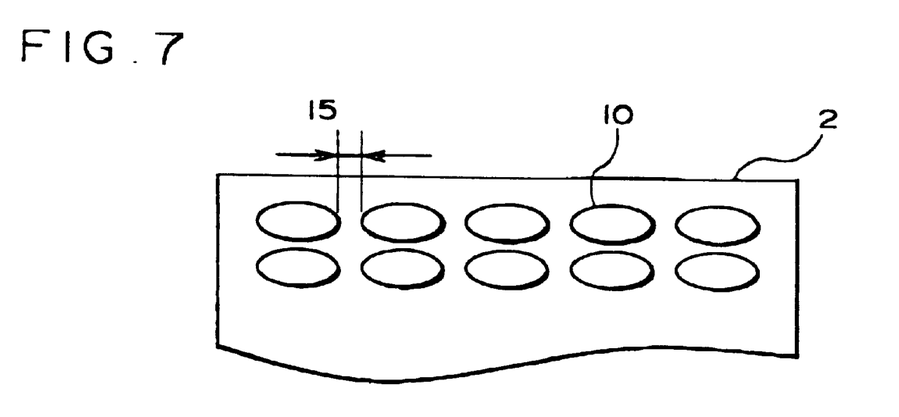
FIG. 7 is a plan view of a main portion of a fourth embodiment of the present invention.
Figure 8:
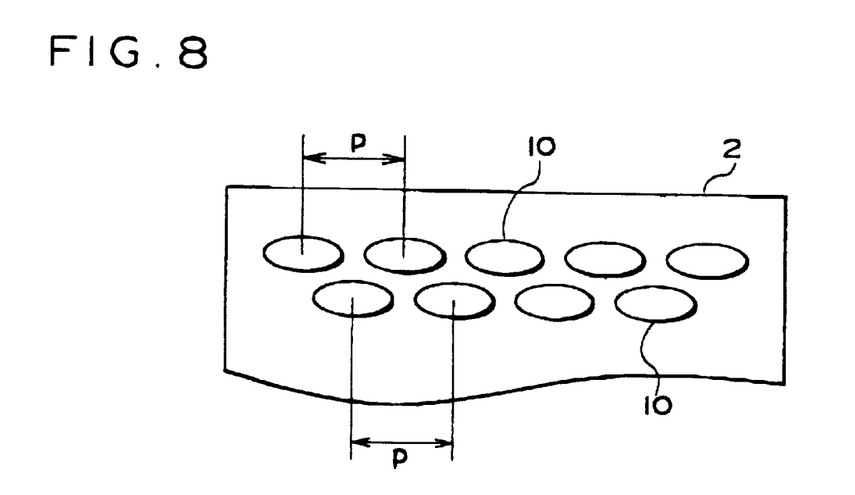
FIG. 8 is a plan view of a main portion of a fifth embodiment of the present invention.

FIGS. 7 and 8 show tape carrier packages in accordance with a fourth embodiment and a fifth embodiment of the present invention. The basic structure thereof is the same as the one shown in FIG. 1. Embodiment shape and arrangement of the protrusions 10 of FIG. 1 are shown in FIGS. 7 and 8.

In the fourth embodiment shown in FIG. 7, a plurality of protrusions 10 are disposed in two rows at equal intervals in parallel with the device hole 3. As described above, since the protrusions 10 contact the film carrier 1, the protection resin 6, that is coated to cover the surfaces of the inner leads 4 and the integrated circuit element 2, flows through the gaps 15 between the protrusions 10, and reaches the peripheral edge sections of the integrated circuit element 2. The protection resin 6 extends by a flow length 8 to a point outside of the peripheral edge section of the integrated circuit element 2, as shown in FIG. 2.

In the fifth embodiment shown in FIG. 8, a plurality of protrusions 10 are disposed in two rows in which the protrusions 10 in both of the rows are arranged in the same pitch p, and the rows of the protrusions 10 are arranged in phases deviated from each other in a staggered manner. As a result, the protection resin 10 flows around the protrusions 10, and thus the fluid resistance obtained by the embodiment of FIG. 8 is greater than that obtained by the embodiment of FIG. 7, with the result that a desired flow length 8 shown in FIG. 2 is obtained in a typical tape carrier package shown in FIG. 1. In accordance with the present embodiment, the fluid resistance to the protection resin 6 is changed without changing the size of the protrusions 10, and therefore the protrusions 10 can be readily formed. It is noted that the protrusions 10 may be formed in three or more rows.

Figure 9:
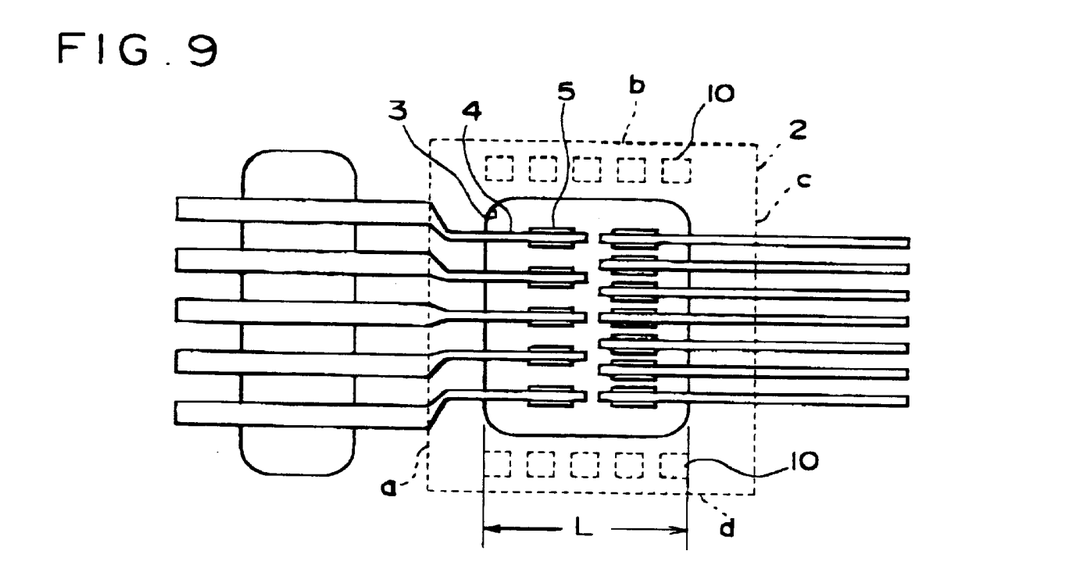
FIG. 9 is a plan view of a main portion of a sixth embodiment of the present invention.

FIG. 9 is a plan view of a main portion of the structure of a tape carrier package in accordance with a sixth embodiment of the present invention. In the case of this embodiment, the protrusions 10 are disposed along the free edges b and d where the integrated circuit element 2 is not provided with electrodes, and within the width L of the device hole 3 corresponding to these edges b and d. Protrusions 10 are not provided outside of the width L.

According to the tape carrier package structure of the sixth embodiment thus structured, protrusions 10 are not provided in corner sections of the integrated circuit element 2 where electrodes are not provided. As a result, when the viscosity of the coated protection resin 6 is high (for example, more than 900 poise), or the thixotropy is also high (for example, more than 2.0) in addition to a high viscosity, the resin flows well in the corner sections, and the protection resin 6 having such a low fluidity can be uniformly flowed and spread.

Figure 10:
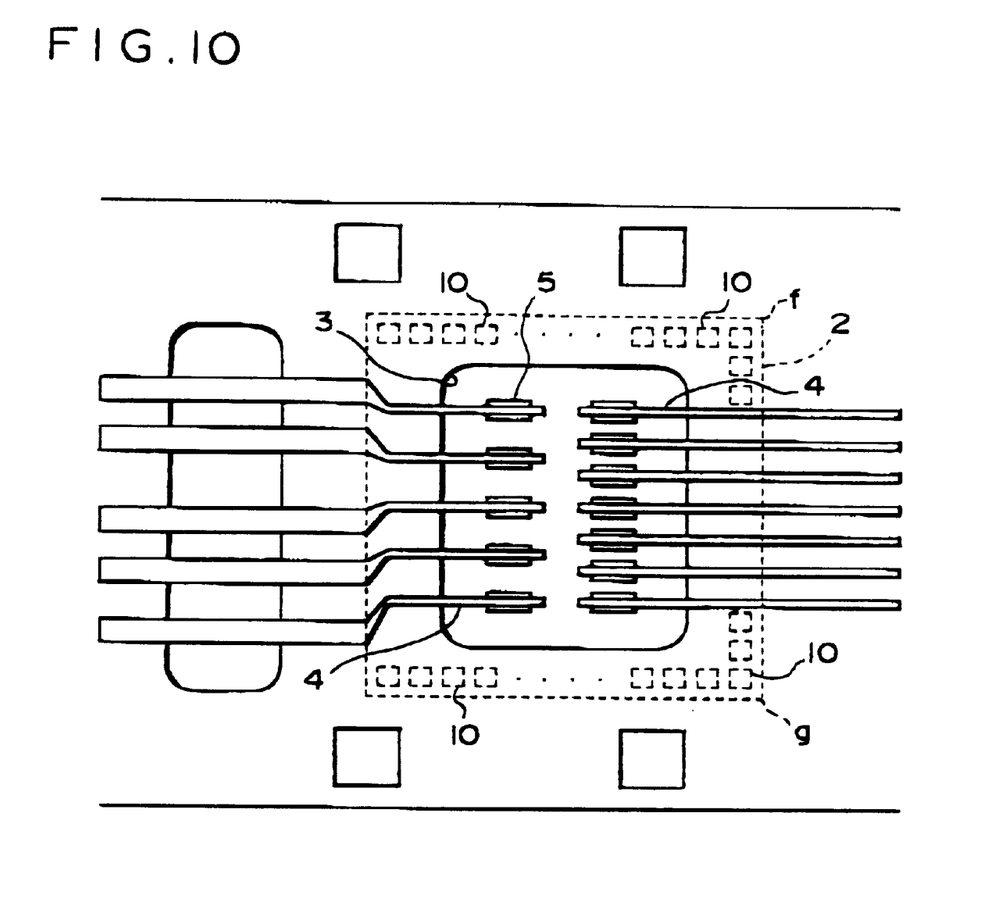
FIG. 10 is a plan view of a seventh embodiment of the present invention.

FIG. 10 is a plan view of the structure of a tape carrier package in accordance with a seventh embodiment of the present invention. In the seventh embodiment, the protrusions 10 are disposed along the free edges b and d of the integrated circuit element 2 where electrodes are not provided and in corner sections f and g at the ends of the edges b and d. In accordance with the present embodiment thus structured, the protrusions 10 are also disposed in the corner sections f and g of the integrated circuit element 2 where inner leads are not disposed. As a result, when the viscosity of the protection resin 6 is low (for example, less than 100 poise), or the thixotropy is low (for example, less than 1.1) in addition to a low viscosity, the resin is prevented from unnecessarily flowing through the corner sections, and the resin having such a high fluidity can be uniformly flowed and spread.

As described above, in the tape carrier packages in accordance with the present invention, flow control members are provided along free edges of an integrated circuit element where electrodes are not provided. As a result, the width of protection resin that flows out beyond peripheral edges of the integrated circuit element can be restricted to a level of the gap between the film carrier and the integrated circuit element. Also, the protection resin remains at positions where it is applied due to the fluid resistance generated by the protrusions, and therefore the thickness of the protection resin on the integrated circuit element is hard to reduce.

Furthermore, in accordance with the present invention, flow control members are provided along free edges of an integrated circuit element where electrodes are not provided and in corner sections adjacent the ends of these edges. As a result, when protection resin has a relatively high fluidity, the width of protection resin that externally flows out beyond peripheral edges of the integrated circuit element can be restricted to a level of the gap between the film carrier and the integrated circuit element.

What is claimed is:

1. A tape carrier package comprising:

an integrated circuit element having a first free edge that is provided with electrodes, the integrated circuit element having a second free edge that is not provided with electrodes;

a flexible film defining a device hole that is smaller than the integrated circuit element and in which the electrodes of the integrated circuit element are disposed;

a plurality of leads provided on the flexible film and connected to the electrodes through the device hole; and at least one flow restricting member disposed between the integrated circuit element and the flexible film at a position on the integrated circuit element adjacent the second free edge between the electrodes and the second free edge, the flow restricting member restricting a flow of a resin along the second free edge of the integrated circuit element.

2. The tape carrier package according to claim 1, wherein said at least one flow restricting member comprises a plurality of flow restricting members that are provided along the second free edge of the integrated circuit element.

3. The tape carrier package according to claim 2, wherein the flow restricting members are disposed within a width L of the device hole.

4. The tape carrier package according to claim 2, wherein the flow restricting members extend beyond a width L of the device hole.

5. The tape carrier package according to claim 2, wherein the flow restricting members are disposed at equal intervals.

6. The tape carrier package according to claim 2, wherein each of the electrodes of the integrated circuit element has an oval shape and each of the flow restricting members has a shape substantially equal to the oval electrodes of the integrated circuit element.

7. The tape carrier package according to claim 2, wherein the flow restricting members are formed from a resin.

8. The tape carrier package according to claim 2, wherein the flow restricting members are disposed in a row.

9. The tape carrier package according to claim 2, wherein the flow restricting members are disposed in two or more rows.

10. The tape carrier package according to claim 9, wherein a group of the flow restricting members disposed in one of the rows are arranged in a shifted position along the row from an adjacent group of the flow restricting members.

11. The tape carrier package according to claim 2, wherein when a press-down forming distance of the leads is between 50 $\mu$m~150 $\mu$m, a distance between one of the electrodes of the integrated circuit element and one of the flow restricting members is between 150 $\mu$m~850 $\mu$m.

12. The tape carrier package according to claim 2, wherein one of the flow restricting members is positioned at an end portion along the second free edge of the integrated circuit element, the end portion defining an angle portion of the integrated circuit element.

13. The tape carrier package according to claim 5, wherein one of the flow restricting members is positioned at an end portion along the second free edge of the integrated circuit element, the end portion defining an angle portion of the integrated circuit element.

14. The tape carrier package according to claim 6, wherein one of the flow restricting members is positioned at an end portion along the second free edge of the integrated circuit element, the end portion defining an angle portion of the integrated circuit element.

15. The tape carrier package according to claim 7, wherein one of the flow restricting members is positioned at an end portion along the second free edge of the integrated circuit element, the end portion defining an angle portion of the integrated circuit element.

16. The tape carrier package according to claim 8, wherein one of the flow restricting members is positioned at an end portion along the second free edge of the integrated circuit element, the end portion defining an angle portion of the integrated circuit element.

17. The tape carrier package according to claim 9, wherein one of the flow restricting members is positioned at an end portion along the second free edge of the integrated circuit element, the end portion defining an angle portion of the integrated circuit element.

18. The tape carrier package according to claim 10, wherein one of the flow restricting members is positioned at an end portion along the second free edge of the integrated circuit element, the end portion defining an angle portion of the integrated circuit element.

* * * * *